United States Patent [19]
Ohya et al.

[11] Patent Number: 6,111,339
[45] Date of Patent: Aug. 29, 2000

[54] POROUS PIEZOELECTRIC CERAMIC SHEET AND PIEZOELECTRIC TRANSDUCER

[75] Inventors: Shigemasa Ohya; Kenji Sekimori; Norihiro Nishio, all of Ueda, Japan

[73] Assignee: Ueda Japan Radio Co., Ltd., Nagano, Japan

[21] Appl. No.: 09/373,332

[22] Filed: Aug. 12, 1999

[30] Foreign Application Priority Data

Aug. 12, 1998 [JP] Japan .................................. 10-242584

[51] Int. Cl.$^7$ ...................................................... H01L 41/08
[52] U.S. Cl. ........................ 310/358; 252/62.9; 310/359; 310/366
[58] Field of Search ...................................... 310/358, 359, 310/311, 366; 252/62.9

[56] References Cited

U.S. PATENT DOCUMENTS

| | | | |
|---|---|---|---|
| 4,686,409 | 8/1987 | Kaarmann et al. | 310/358 |
| 4,777,153 | 10/1988 | Sonuparlak et al. | 310/358 X |
| 5,874,126 | 2/1999 | Kahn et al. | 310/358 X |

*Primary Examiner*—Mark O. Budd
*Attorney, Agent, or Firm*—Reed Smith Shaw McClay LLP

[57] ABSTRACT

A thin porous piezoelectric $Pb(Zr,Ti)O_3$ ceramic sheet having a thickness of 0.05 to 2 mm which is favorably employable for manufacturing a piezoelectric transducer has small pores essentially all of which have a size of less than 25 $\mu$m in which pores having a size of 5 to 25 $\mu$m have a mean pore size of 1/10 to 1/1,000 based on the thickness of the ceramic sheet, and which shows a ratio of apparent density to true density in the range of 5/10 to 9/10.

10 Claims, 6 Drawing Sheets

POROUS PIEZOELECTRIC CERAMIC SHEET AND PIEZOELECTRIC TRANSDUCER

FIELD OF THE INVENTION

The present invention relates to a porous piezoelectric ceramic sheet and a piezoelectric transducer. In particular, the invention relates to a porous piezoelectric lead zirconate titanate ceramic sheet and a piezoelectric transducer using the porous lead zirconate titanate ceramic sheet.

BACKGROUND OF THE INVENTION

Ultrasonic wave is propagated through material and reflected on an interface between the material and a foreign substance or a vacancy contained in the material, because such foreign substance and vacancy shows an acoustic impedance differing from that of the material. Utilizing this characteristic, ultrasonic wave can be employed for detecting foreign substances and defects in the target material without destruction of the target material. Accordingly, non-destructive inspection using ultrasonic wave is used in a variety of technical fields such as diagnostics, inspections of metallic material, inspections of buildings, and detections of a group of fishes in the seas or lakes.

The ultrasonic wave can be produced by applying a voltage of a high frequency to a piezoelectric transducer which is manufactured by placing an electrode on each surface side of a piezoelectric sheet and then applying a voltage between these electrodes. The piezoelectric transducer receives a reflected ultrasonic wave and convert the received ultrasonic wave to electric signals. Various materials showing the piezoelectric characteristic are known. For example, the piezoelectric sheet can be formed of a single crystal such as crystallized quartz, a sintered piezoelectric ceramic, a piezoelectric polymer material, and a mixture of a piezoelectric ceramic and a polymer resin. A piezoelectric sheet of sintered piezoelectric ceramic is widely employed for manufacture of a piezoelectric transducer because it gives a high electromechanical coupling factor. Examples of the piezoelectric ceramics include barium titanate, lead titanate, and lead zirconate titanate $(Pb(Zr, Ti)O_3)$, which is generally referred to as PZT or P-PZT (i.e., piezoelectric PZT). PZT is most widely utilized.

The piezoelectric sheet to be employed as a source of ultrasonic wave in a ultrasonic detector preferably shows an acoustic impedance similar to that of the material to be inspected. Further, it is preferred for the piezoelectric sheet to emit a ultrasonic wave having a mono pulse wave form so that the defects and foreign substances in the inspected material are accurately detected.

In the fields of ultrasonic inspection, there are fields in which the ultrasonic wave should be propagated into water, air, or living body having water and air therein. For instance, ultrasonic diagnostic system, ultrasonic flow meter system, and ultrasonic blood flow meter system are mentioned. It is a problem that the acoustic impedance of water, air, and living body is lower than the acoustic impedance of ordinary piezoelectric ceramic materials.

In order to adjust the difference of acoustic impedance between the piezoelectric ceramic sheet and the inspected material and to enhance sensitivity of ultrasonic inspection equipment, an acoustic impedance-adjusting material is conventionally attached to a piezoelectric transducer of the inspection equipment. However, the adjustment of acoustic impedance using the acoustic impedance-adjusting material is limitative.

Japanese Journal of Applied Physics, Vol. 30, No. 9B, September, 1991, pp. 2271–2273 describes a porous piezoelectric PZT ceramic transducer exhibiting improved characteristics such as a large piezoelectric voltage coefficient (g constant), a low acoustic impedance $(Z_0)$ and a low Q. In the publication, a sintered PZT disk having a diameter of 50 mm and a thickness of 8 mm is prepared by mixing powders of PZT and PMMA (poly(methyl methacrylate)) having average particle sizes of 1.2 $\mu$m and 30 $\mu$m, pressing the mixture to form a disc, heating the disc to 400° C. to burn out PMMA and finally sintering the heated disc.

Japanese Journal of Applied Physics, Vol. 31, Part 1, No. 9B, September, 1992, pp. 3067–3069 describes transmitting properties of porous PZT transducer which is produced in the same manner as that described in the above-identified publication.

Japanese Patent Provisional Publication No. 1-172281 describes a porous dielectric material for piezoelectric transducer having pore volume of 23 to 45% and main pores having a size of 20 to 44 $\mu$m. No mention is given with respect to the preparation of a thin piezoelectric sheet.

Japanese Patent Provisional Publication No. 1-171281 describes a porous piezoelectric transducer having a coat of glass material on each surface side and an electrode on each glass material coat.

Japanese Patent Provisional Publication No. 4-300253 describes a process for producing a porous piezoelectric element using a PZT powder, a binder, and a combustible polymer powder. No mention is given with respect to the preparation of a thin piezoelectric sheet.

In the detection of small defective portions and small foreign substances in the target material, a ultrasonic wave having a frequency of 1 to 30 MHz is employed. In order to emit a ultrasonic wave of a frequency of 1–30 MHz, a piezoelectric transducer should have a piezoelectric sheet of 0.05 to 2.0 mm thick. Moreover, the piezoelectric transducer having such a small thickness still has a uniform piezoelectric characteristic within the piezoelectric sheet.

Until now, there has been not known a thin porous piezoelectric ceramic sheet which is capable of reliably emitting a ultrasonic wave having a frequency of 1 to 30 MHz and further capable of receiving a reflected ultrasonic wave at a satisfactorily high sensitivity.

SUMMARY OF THE INVENTION

It is a main object of the present invention to provide a thin porous piezoelectric ceramic sheet which reliably emits a ultrasonic wave having a frequency of 1 to 30 MHz and receives a reflected ultrasonic wave at a high sensitivity.

There is provided by the invention a porous piezoelectric ceramic sheet having a thickness in the range of 0.05 to 2 mm and comprising $Pb(Zr,Ti)O_3$, namely, lead zirconate titanate (i.e., PZT), which has pores essentially all of which have a size of less than 25 $\mu$m in which pores having a size in the range of 5 to 25 $\mu$m have a mean pore size in the range of 1/10 to 1/1,000 based on the thickness of the ceramic sheet, and which shows a ratio of apparent density to true density in the range of 5/10 to 9/10.

The lead zirconate titanate may comprise a small amount of oxides and may comprise a piezoelectric perovskite ceramic.

The sizes of the pores in the porous piezoelectric ceramic sheet of the invention are determined by enlarging the surface of the porous sheet by electron microscopic picture to 200 magnifications (×200) or more, measuring sizes of the pores seen in the enlarged picture using a measuring apparatus such as slide calipers, and dividing the measured sizes by the magnification value. The average size is expressed in terms of arithmetic average.

The invention further provides a piezoelectric transducer utilizing the above-mentioned porous piezoelectric ceramic sheet.

The invention furthermore provides an array of the above-mentioned piezoelectric transducers.

Preferred embodiments of the invention are set forth below.

(1) The porous piezoelectric ceramic sheet having a thickness in the range of 0.1 to 2 mim.

(2) The porous piezoelectric ceramic sheet, in which the pores having a size in the range of 5 to 25 μm have a mean pore size in the range of 1/10 to 1/100 based on the thickness of the ceramic sheet.

(3) The porous piezoelectric ceramic sheet, in which essentially all of the pores have a size of less than 15 μm.

(4) The porous piezoelectric ceramic sheet, in which pores having a size in the range of 5 to 15 μm have a mean pore size in the range of 1/10 to 1/50 based on the thickness of the ceramic sheet.

(5) The porous piezoelectric ceramic sheet, in which the apparent density is in the range of 5.0 to 6.5 g/cm$^3$.

(6) A piezoelectric transducer which is manufactured by the steps of placing an electrode on each surface side of a porous piezoelectric ceramic sheet of the invention, and applying a voltage between the electrodes to cause polarization in the ceramic sheet.

(7) A piezoelectric transducer which is manufactured by the steps of placing an electric insulating coat on each surface side of a porous piezoelectric ceramic sheet of the invention, placing an electrode on each electric insulating coat, and applying a voltage between the electrodes to cause polarization in the ceramic sheet.

(8) An array of piezoelectric transducers comprising a plurality of the piezoelectric transducers of the invention which are aligned adjacently to each other.

DETAILED DESCRIPTION OF THE INVENTION

Figure 1:
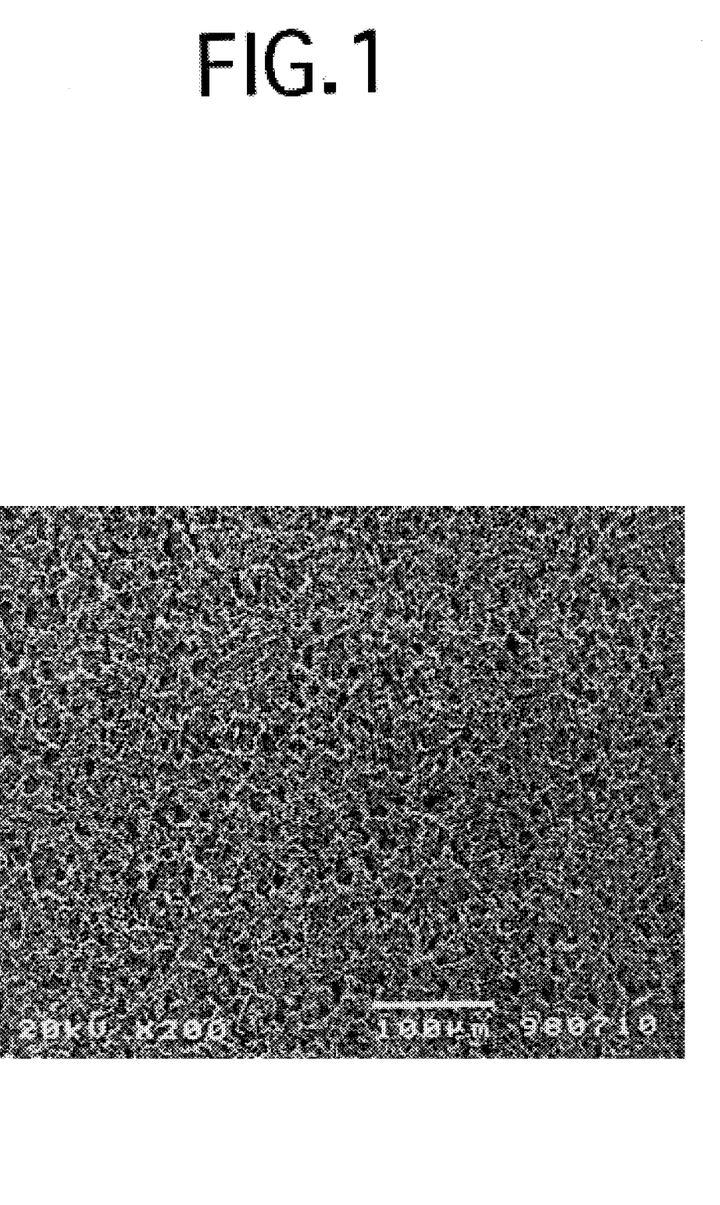
FIG. 1 is an electron microscopic picture showing surface conditions of the porous piezoelectric PZT ceramic sheet of the invention.

As is seen in the microphotographic picture of FIG. 1, the porous piezoelectric ceramic sheet of the invention has extremely small pores which are dispersed in the ceramic sheet uniformly.

The porous piezoelectric ceramic sheet of the invention has a thickness of 0.05 to 2 mm, preferably 0.1 to 2 mm, more preferably 0.1 to 1.0 mm, most preferably 0.1 to 0.6 mm. A ratio of apparent density to true density of the porous piezoelectric ceramic sheet is in the range of 5/10 to 9/10.

The pores in the porous piezoelectric ceramic sheet of the invention satisfy the following conditions:

essentially all pores have a size of less than 25 μm; and pores having a size in the range of 5 to 25 μm have a mean pore size in the range of 1/10 to 1/1,000 based on the thickness of the ceramic sheet.

The thin porous piezoelectric ceramic sheet of the present invention can be prepared by the process which comprises:

(1) a step of mixing in an aqueous medium a powdery piezoelectric ceramic material (its average particle size is in the range of 0.1 to 2.0 μm), a combustible powder (for instance, of poly(methyl methacrylate)) comprising particles essentially all of which a size of less than 25 μm, and a binder such as polyvinyl alcohol;

(2) a step of spraying the resulting aqueous mixture using pressurized gas to produce a dry powder;

(3) a step of moulding the dry powder under pressure (such as a pressure in the range of 0.5 to 2 tons/cm$^2$, preferably 0.8 to 1.3 tons/cm$^2$, to give a compressed sheet;

(4) a step of heating the sheet to burn out the combustible powder, while keeping the binder in the sheet;

(5) a step of heating the sheet to an elevated temperature (e.g., a temperature of 1,000 to 1,400° C., preferably 1,200 to 1,300° C.) for sintering the heated sheet; and (6) a step of decreasing the thickness of the sintered sheet, for instance, by slicing or polishing the sintered sheet to give a thin porous piezoelectric ceramic sheet of the desired thickness.

Figure 2:
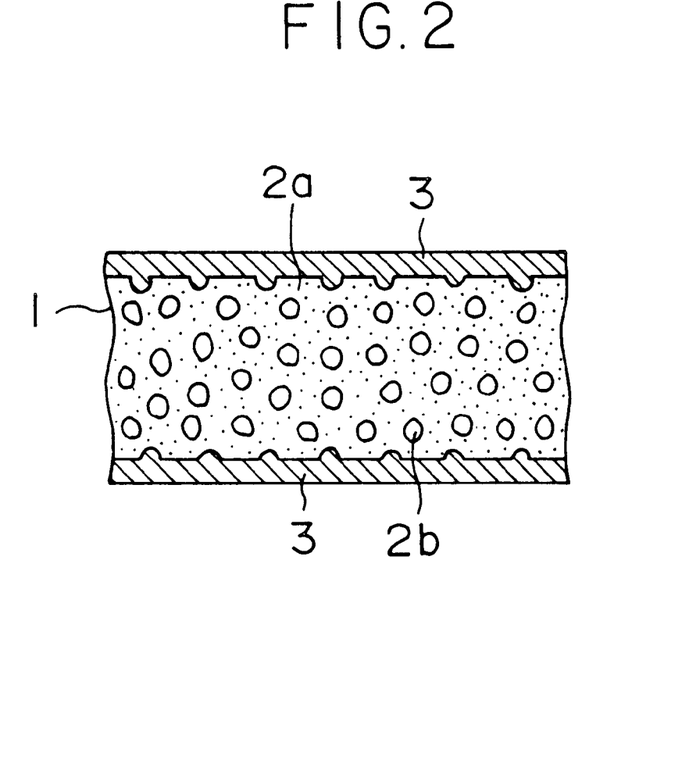
FIG. 2 is a schematic sectional view of a piezoelectric transducer comprising the porous piezoelectric ceramic sheet of the invention and electrodes placed on each surface side of the ceramic sheet.
Figure 3:
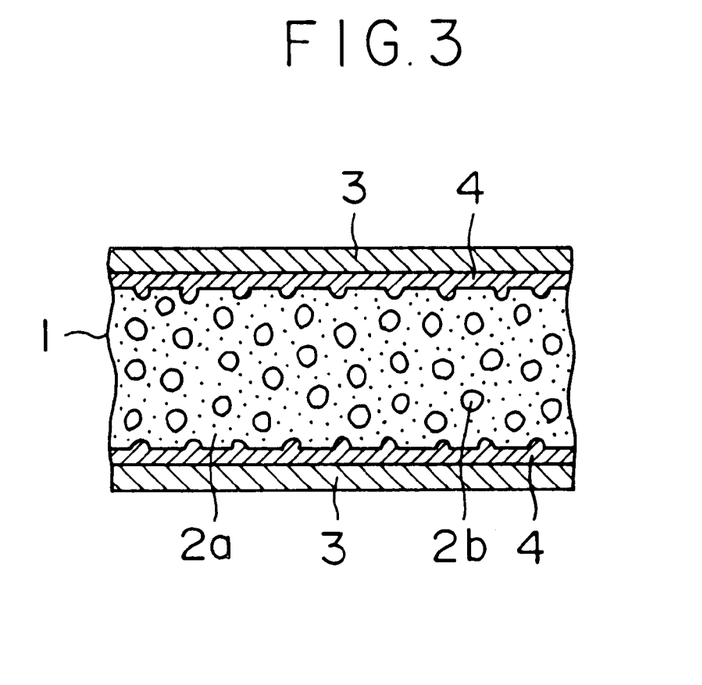
FIG. 3 is a schematic sectional view of a piezoelectric transducer comprising the porous piezoelectric ceramic sheet of the invention, an insulating coat placed on each surface side of the ceramic sheet, and an electrode placed on each insulating coat.

The piezoelectric transducer of the invention typically has a section illustrated in FIGS. 2 and 3 in the attached drawing.

The piezoelectric transducer of FIG. 2 is prepared by placing on each surface side of the thin porous piezoelectric ceramic sheet 1 of the invention (comprising piezoelectric material 2a and small pores 2b) an electrode 3 by screen printing, sputtering or vapor deposition. The printed electrode is generally heated to a temperature of 600 to 800° C. The porous piezoelectric ceramic sheet is then polarized by applying a voltage between the electrodes. The polarization of the porous piezoelectric transducer is preferably carried out in a volatile liquid medium having a boiling point higher than the polarizing temperature (generally in the range of 50 to 150° C.) and lower than a Curie temperature of the piezoelectric ceramic material. Examples of the volatile liquid mediums include fluorine-containing liquid compounds. The polarization may be performed in air by applying a voltage of less than 1 kV/mm between the electrodes.

The piezoelectric transducer of FIG. 3 is prepared by coating on each surface side of the thin porous piezoelectric ceramic sheet 1 of the invention (comprising piezoelectric material 2a and small pores 2b) a layer of insulating glass material 4, and then placing an electrode 3 on each glass material coat. The coat of glass material serves to keep the electrode material from entering the pores of the porous piezoelectric ceramic sheet so that the piezoelectric characteristic of the piezoelectric transducer can be maintained uniform in the plane direction. The porous piezoelectric ceramic sheet is then polarized by applying a voltage between the electrodes.

Figure 4:
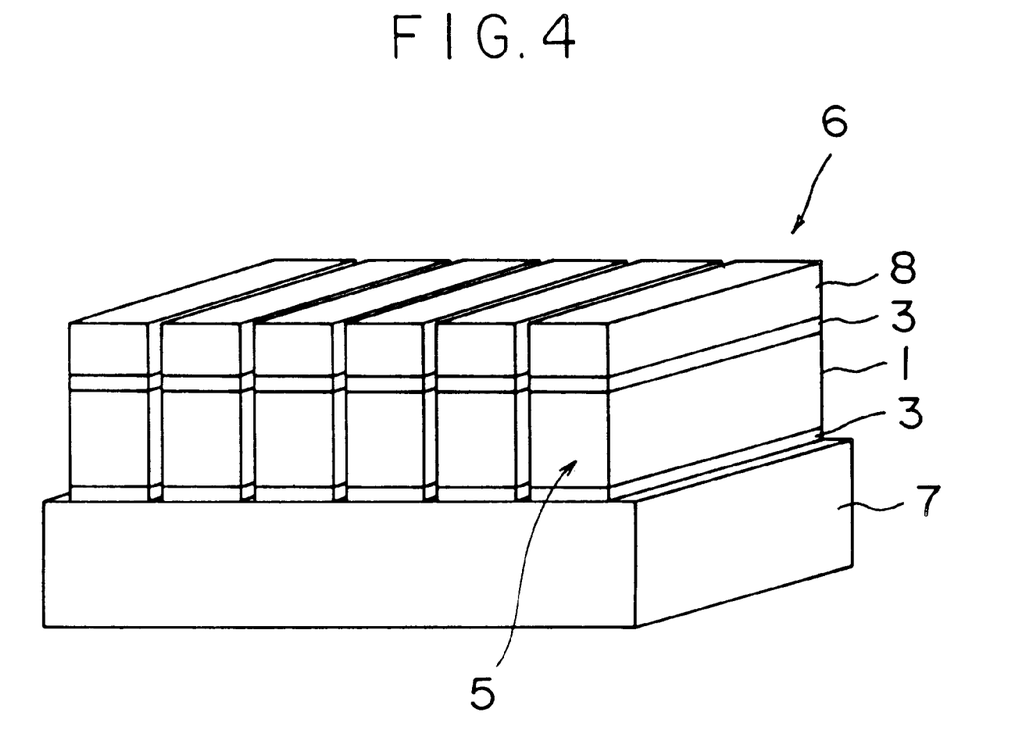
FIG. 4 is a schematic view of an array of the piezoelectric transducers according to the invention.

FIG. 4 illustrates an array of piezoelectric transducers 6 which are manufactured utilizing a porous piezoelectric ceramic sheet of the invention. In the array, a piezoelectric transducer 5 comprising the porous piezoelectric ceramic sheet 1 and a pair of electrodes 3 has on the upper electrode an acoustic impedance-adjusting layer 8. Since each of the porous piezoelectric sheet has the conditions of the invention, the piezoelectric transducers in the array show equivalent piezoelectric characteristics.

The piezoelectric transducer of the invention can be utilized in a variety of ultrasonic testing or measuring apparatuses. Their examples are illustrated in FIGS. 5 to 10 of the attached drawings.

Figure 5:
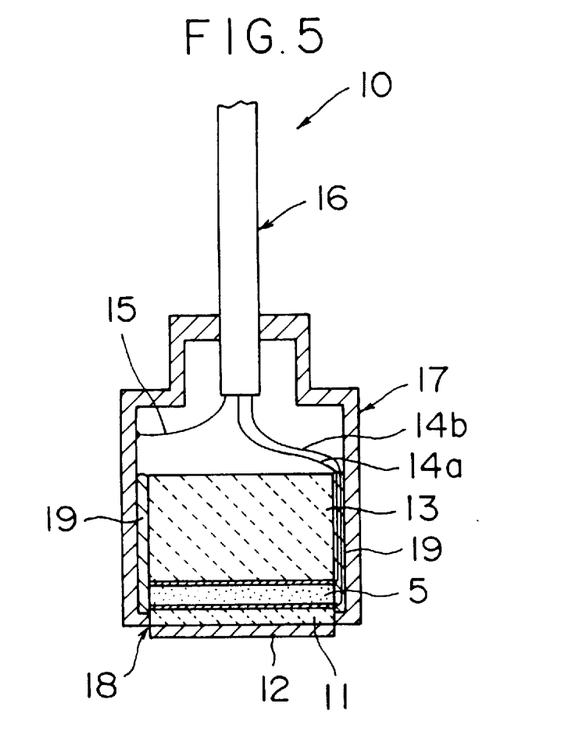
FIG. 5 is a schematic section view of a probe (of single element type) of a ultrasonic diagnostic equipment utilizing a piezoelectric transducer of the invention.

FIG. 5 is a schematic sectional view of a probe (of single element type) 10 of a ultrasonic diagnostic equipment. The probe 10 has the piezoelectric transducer 5 of the invention in a casing 17 (made of metal) at the opening 18 of the casing. Under the transducer 5, an acoustic impedance-adjusting layer 11 is provided. Under the adjusting layer 11, an acoustic lens 12 is placed. On the transducer 5, a damper material layer 13 is placed. A cable 16 is inserted from the top opening of the casing. From the cable 16, lead wires 14a, 14b are drawn to connect to both electrodes of the transducer 5, respectively. An earth wire 15 is also drawn from the cable 16 and attached to the casing 17. The composite of the piezoelectric transducer 5, adjusting layer 11 and damper material layer 13 is shielded from the metal casing 17 by an insulating wall 19.

Figure 6:
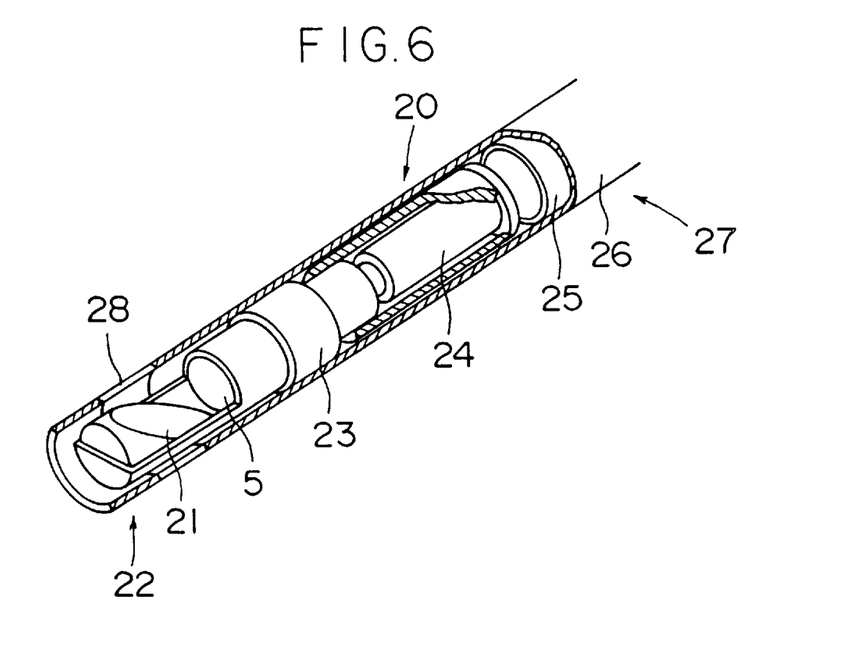
FIG. 6 is a partly broken schematic view of a catheter probe of a ultrasonic diagnostic equipment utilizing a piezoelectric transducer of the invention.

FIG. 6 is a partly broken schematic view of a catheter probe 20 of a ultrasonic diagnostic equipment utilizing the piezoelectric transducer.

The catheter prove 20 has the piezoelectric transducer 5 in a cylindrical casing 27 which has an acoustic winder 28 on a side wall of the casing. The cylindrical casing 27 comprises a plastic inner tube 15 and a plastic covering tube 26. Between the transducer 5 and the inner tube 15 are provided a bearing 23 and a rotatable axis 24 which serve in cooperation to rotate the transducer 5 within the cylindrical casing 27. At the top of the casing 27, there is provided a ultrasonic wave transmitting and receiving area 22 having a mirror 21, which is rotatable in combination with the transducer 5.

Figure 7:
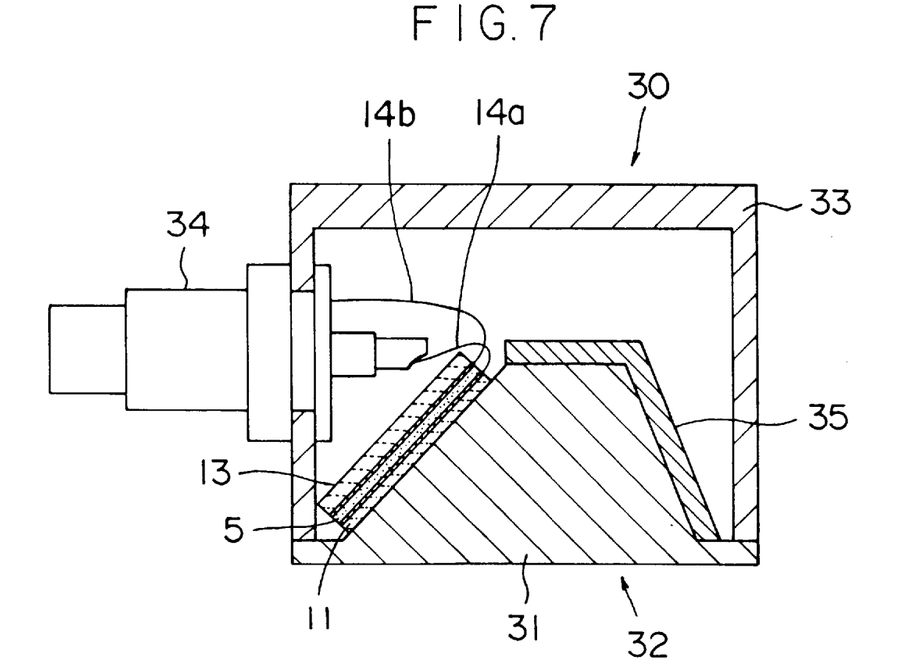
FIG. 7 is a schematic sectional view of a piezoelectric transducer of the invention for a ultrasonic flow meter.

FIG. 7 is a schematic sectional view of the piezoelectric transducer 30 for a ultrasonic flow meter.

The piezoelectric transducer 30 has the piezoelectric transducer 5 of the invention in a casing 33. Under the transducer 5, an acoustic impedance-adjusting layer 11 is provided. On the transducer 5 is provided a damper material layer 13. On the bottom of the casing 33, there is provided a combination of a wedge 31 and a bottom plate 32. On the wedge 31, a acoustic-absorbing material layer 35 is placed. From the side wall of the casing 33, a connector 34 which is connected to an outer flow meter (not illustrated). From the connector 34, two lead wires 14a, 14b are drawn to connect to the electrodes of the transducer 5.

Figure 8:
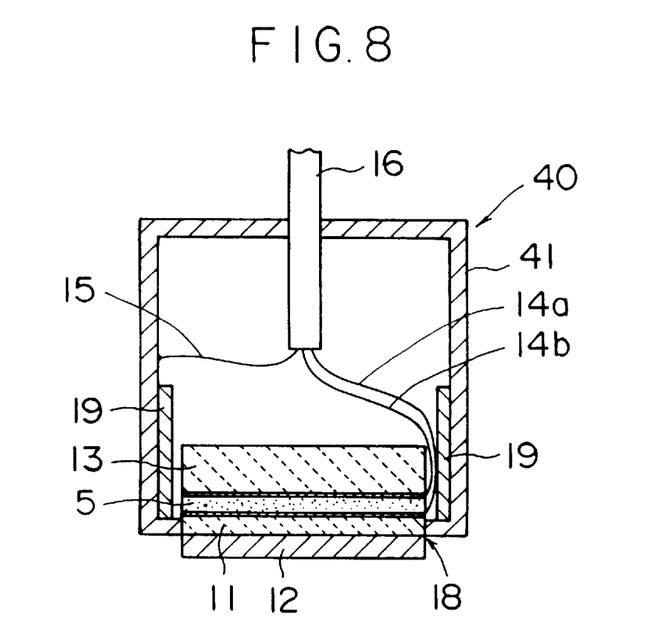
FIG. 8 is a schematic sectional view of a piezoelectric transducer of the invention for a ultrasonic testing apparatus.

FIG. 8 is a schematic sectional view of the piezoelectric transducer means 40 for a ultrasonic testing apparatus. The transducer means (probe) 40 has the piezoelectric transducer 5 in a casing 41 (made of metal) at the opening 18 of the casing. Under the transducer 5, an acoustic impedance-adjusting layer 11 is provided. Under the adjusting layer 11, an acoustic lens 12 is placed. On the transducer 5, a damper material layer 13 is placed. A cable 16 is inserted from the top opening of the casing. From the cable 16, two lead wires 14a, 14b are drawn to connect to both electrodes of the transducer 5, respectively. An earth wire 15 is also drawn from the cable 16 and attached to the casing 41. The composite of the piezoelectric transducer 5, adjusting layer 11 and damper material layer 13 is shielded from the metal casing 41 by an insulating wall 19.

Figure 9:
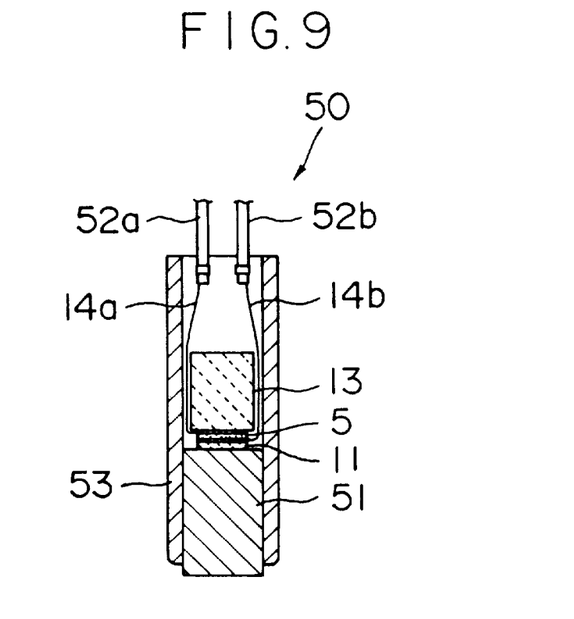
FIG. 9 is a schematic sectional view of a piezoelectric transducer of the invention for a ultrasonic thickness meter.

FIG. 9 is a schematic sectional view of a piezoelectric transducer means 50 for a ultrasonic thickness meter.

The transducer means 50 has a piezoelectric transducer element 5 of the invention in a cylindrical casing 53. Under the transducer 5, an acoustic impedance-adjusting layer 11 is provided. Under the adjusting layer 11, an acoustic retarding material 51 is placed. On the transducer 5, a damper material layer 13 is placed. A pair of connecting pins 52a, 52b are inserted from the top opening of the casing. From each of the connecting pins 52a, 52b, two lead wires 14a, 14b are drawn to connect to both electrodes of the transducer 5, respectively.

Figure 10:
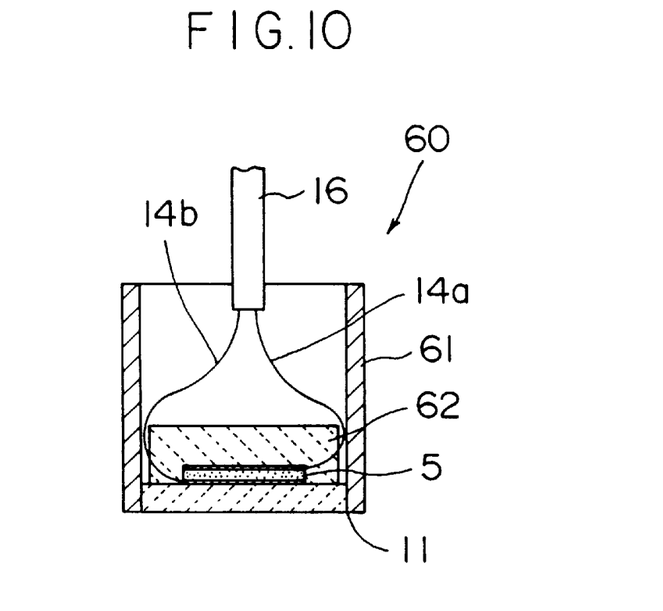
FIG. 10 is a schematic sectional view of a piezoelectric transducer of the invention for a ultrasonic bubble-detecting apparatus.

FIG. 10 is a schematic sectional view of a piezoelectric transducer means 60 of the invention for a ultrasonic bubble-detecting apparatus.

The transducer means 60 has a piezoelectric transducer element 5 of the invention in a casing 61. Under the transducer 5, an acoustic impedance-adjusting layer 11 is provided. On the transducer 5, a noise insulation material layer 62 is placed. A cable 16 is inserted from the top opening of the casing. From each of the cable 16, two lead wires 14a, 14b are drawn to connect to both electrodes of the transducer 5, respectively.

Typical examples of detecting or testing apparatuses utilizing a piezoelectric transducer of the invention have been described by referring to the attached drawings. However, the piezoelectric transducer of the invention can be utilizable in a variety of detecting or testing apparatuses other than these illustrated. Examples of the other apparatuses include a communicator utilizing ultrasonic wave to be employed in water such as in sea, and a multilayer actuator comprising a laminated piezoelectric transducers.

EXAMPLE 1

In a vessel were placed 45 weight parts of PZT powder (average particle size: 1.5 $\mu$m), 5 weight parts of poly (methyl methacrylate) (average particle size: 10 $\mu$m, heat decomposition-initiating temperature: 250° C., heat decomposition-terminating temperature: 450° C.), and 50 weight parts of an aqueous polyvinyl alcohol solution (concentration of PVA: 2.5 wt. %). These materials were well mixed to give a slurry product. The slurry product was sprayed using a pressurized air to give a dry powder.

Sixty grams of the dry powder were taken and placed in a mold (80 mm×20 mm). In the mould, the powder was pressed at 1 ton/cm$^2$. The molded product was heated to 1,270° C. for one hour to give a porous sheet. The porous sheet was then polished to give a thin porous sheet having a thickness of 0.5 mm.

The surface of the thin porous sheet was checked by electron microscopic observation using an electron microscopic apparatus (JSM-5310, Japan Electron Co., Ltd.). The microscopic photograph is given in FIG. 1 of the attached drawings. It was confirmed that almost all pores are uniformly dispersed in the porous sheet. It was also confirmed that all pores had a pore size less than 15 µm, an average size of pores having a pore size range of 5 to 15 µm was 10 µm. The apparent density of the thin porous sheet was 6.0 g/cm$^3$, while its true density was 7.7 g/cm$^3$.

On both surface of the thin porous sheet was placed an electroconductive silver paste by screen printing. The printed silver paste was heated to 700° C. to form an electrode on each side. A voltage of 0.5 kv/mm was applied between the two electrodes to polarize the porous sheet. Thus, a piezoelectric transducer was prepared. The acoustic impedance of thus prepared piezoelectric transducer was lower than that of the conventional piezoelectric transducer. The mechanical quality factor (Qm) was also lower than that of the conventional piezoelectric transducer.

EXAMPLE 2

The thin porous piezoelectric sheet produced in Example 1 was further polished to give a thinner porous piezoelectric sheet of 0.238 mm thick. On both surface of the thinner porous sheet was placed an electroconductive silver paste by screen printing. The printed silver paste was heated to 700° C. to form an electrode on each side. A voltage of 0.5 kV/mm was applied between the two electrodes to polarize the porous sheet. Thus, a piezoelectric transducer showing a resonance frequency of 5 MHz was prepared.

Using the above-produced piezoelectric transducer, a ultrasonic flow meter of FIG. 7 was manufactured. The transmitting and receiving voltage sensitivity was measured on the ultrasonic flow meter was measured. The measured value is set forth in Table 1.

For comparison, the same ultrasonic flow meter was manufactured utilizing a conventional piezoelectric transducer having the same thickness. The transmitting and receiving voltage sensitivity was measured on the conventional ultrasonic flow meter was measured. The measured value is also set forth in Table 1.

TABLE 1

|  | Transmitting-receiving voltage sensitivity (dB) |
|---|---|
| Example 2 | −68.37 |
| Comparison | −71.61 |

The results set forth in Table 1 indicate that the ultrasonic flow meter of Example 2 is superior to the ultrasonic flow meter of Comparison.

What is claimed is:

1. A porous piezoelectric ceramic sheet having a thickness in the range of 0.05 to 2 mm and comprising Pb(Zr,Ti)O$_3$, which has pores essentially all of which have a size of less than 25 µm in which pores having a size in the range of 5 to 25 µm have a mean pore size in the range of 1/10 to 1/1,000 based on the thickness of the ceramic sheet, and which shows a ratio of apparent density to true density in the range of 5/10 to 9/10.

2. The porous piezoelectric ceramic sheet of claim 1, wherein the thickness of the ceramic sheet is in the range of 0.1 to 2 mm.

3. The porous piezoelectric ceramic sheet of claim 1, wherein the pores having a size in the range of 5 to 25 µm have a mean pore size in the range of 1/10 to 1/100 based on the thickness of the ceramic sheet.

4. The porous piezoelectric ceramic sheet of claim 1, wherein essentially all of the pores have a size of less than 15 µm.

5. The porous piezoelectric ceramic sheet of claim 4, wherein pores having a size in the range of 5 to 15 µm have a mean pore size in the range of 1/10 to 1/50 based on the thickness of the ceramic sheet.

6. The porous piezoelectric ceramic sheet of claim 1, wherein the apparent density is in the range of 5.0 to 6.5 g/cm$^3$.

7. A piezoelectric transducer which is manufactured by the steps of placing an electrode on each surface side of a porous piezoelectric ceramic sheet of claim 1, and applying a voltage between the electrodes to cause polarization in the ceramic sheet.

8. A piezoelectric transducer which is manufactured by the steps of placing an electric insulating coat on each surface side of a porous piezoelectric ceramic sheet of claim 1, placing an electrode on each electric insulating coat, and applying a voltage between the electrodes to cause polarization in the ceramic sheet.

9. An array of piezoelectric transducers comprising a plurality of piezoelectric transducers of claim 7 which are aligned adjacently to each other.

10. An array of piezoelectric transducers comprising a plurality of piezoelectric transducers of claim 8 which are aligned adjacently to each other.

* * * * *